United States Patent
Gu et al.

(10) Patent No.: US 9,530,978 B2
(45) Date of Patent: Dec. 27, 2016

(54) HOLLOW WHITE COMPOSITE QUANTUM DOT PREPARATION METHOD, DISPLAY PANEL AND DISPLAY DEVICE

(71) Applicant: BOE TECHNOLOGY GROUP CO., LTD., Beijing (CN)

(72) Inventors: Jingxia Gu, Beijing (CN); Chen Tang, Beijing (CN); Zhanfeng Cao, Beijing (CN); Qi Yao, Beijing (CN); Feng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/413,006

(22) PCT Filed: Jun. 10, 2014

(86) PCT No.: PCT/CN2014/079570
§ 371 (c)(1),
(2) Date: Jan. 5, 2015

(87) PCT Pub. No.: WO2015/085734
PCT Pub. Date: Jun. 18, 2015

(65) Prior Publication Data
US 2016/0276613 A1    Sep. 22, 2016

(30) Foreign Application Priority Data
Dec. 9, 2013 (CN) .......................... 2013 1 0664514

(51) Int. Cl.
*H01L 35/24* (2006.01)
*H01L 51/50* (2006.01)
(Continued)

(52) U.S. Cl.
CPC ............. *H01L 51/502* (2013.01); *C09K 11/02* (2013.01); *C09K 11/883* (2013.01);
(Continued)

(58) Field of Classification Search
CPC ...... H01L 51/502; H01L 27/322; C09K 11/02; C09K 11/883; Y10S 977/888; Y10S 977/95; Y10S 977/774; B82Y 20/00; B82Y 40/00
(Continued)

(56) References Cited

U.S. PATENT DOCUMENTS 9,257,600 B2* 2/2016 Tang ................... H01L 33/0083
2014/0374696 A1 12/2014 Liu et al.
2015/0083991 A1* 3/2015 Tang ................... H01L 33/0083
257/13

FOREIGN PATENT DOCUMENTS

CN        1688037 A      10/2005
CN       101036867       9/2007
(Continued)

OTHER PUBLICATIONS

Chinese Office Action with English Language Translation, dated Sep. 25, 2015, Chinese Application No. 201310664514.2.
(Continued)

*Primary Examiner* — Xinning Niu
*Assistant Examiner* — Vu A Vu
(74) *Attorney, Agent, or Firm* — Blakely Sokoloff Taylor & Zafman LLP

(57) ABSTRACT

The embodiments of the invention disclose a hollow white composite quantum dot preparation method, a display panel and a display device. In the preparation method, unicolor quantum dots of different colors are prepared into corresponding unicolor quantum dot emulsions through an emulsion polymerization technique, dissolved silicon dioxide nano particles are used as a seed solution, the individual unicolor quantum dot emulsions are dropped in the seed solution in sequence, such that the surfaces of the silicon dioxide nano particles are coated with the unicolor quantum dots in the individual unicolor quantum dot emulsions in
(Continued)

sequence according to the dropping order so as to obtain white composite quantum dots, and finally, the silicon dioxide nano particles in the white composite quantum dots are removed to obtain hollow white composite quantum dots. The hollow white composite quantum dot particles obtained by the preparation method are controllable in particle size and uniform in size, and the problems of low quantum efficiency, poor stability of quantum dots, and the like are solved; besides, the color gamut of the hollow white composite quantum dots can be adjusted, so that the applicability is high, and the application range is wide; in addition, the preparation method is simple, and a batch production is facilitated.

13 Claims, 3 Drawing Sheets

(51) Int. Cl.
*C09K 11/02* (2006.01)
*C09K 11/88* (2006.01)
*H05B 33/14* (2006.01)
*H01L 27/32* (2006.01)
*B82Y 20/00* (2011.01)
*B82Y 40/00* (2011.01)

(52) U.S. Cl.
CPC .......... *H01L 27/322* (2013.01); *H05B 33/14* (2013.01); *B82Y 20/00* (2013.01); *B82Y 40/00* (2013.01); *Y10S 977/774* (2013.01); *Y10S 977/888* (2013.01); *Y10S 977/95* (2013.01)

(58) Field of Classification Search
USPC ........................................................ 257/40
See application file for complete search history.

(56) References Cited

FOREIGN PATENT DOCUMENTS

| | | |
|---|---|---|
| CN | 101036867 A | 9/2007 |
| CN | 101423758 | 5/2009 |
| CN | 103227189 A | 7/2013 |
| CN | 103346266 | 10/2013 |
| CN | 103421513 A | 12/2013 |
| CN | 103700785 A | 4/2014 |
| KR | 1020120018490 | 3/2012 |
| WO | WO 2013/162646 A1 | 10/2013 |

OTHER PUBLICATIONS

Yongqiang Wang et al., A Facile Method to Synthesize Hierarchical SiO2@CdSe and CdSe Hollow Spheres, Materials Letters 65 (2011) pp. 1601-1604.
Translation of International Search Report dated Jun. 18, 2015 (Application No. PCT/CN2014/079570) (6 pages).
Translation of Text of the First Office Action for Chinese Application No. 2013106645142 (9 pages).
Chinese Office Action with English Language Translation, dated Nov. 3, 2015, Chinese Application No. 201310664514.2.

* cited by examiner

HOLLOW WHITE COMPOSITE QUANTUM DOT PREPARATION METHOD, DISPLAY PANEL AND DISPLAY DEVICE

FIELD OF THE INVENTION

The invention relates to the field of display technology, and in particular, to a hollow white composite quantum dot preparation method, a display panel and a display device.

BACKGROUND OF THE INVENTION

A quantum dot (QD), which may also be called a nanocrystal, is a nano particle composed of II-VI group or III-V group elements. The particle size of a quantum dot is generally between 1 and 20 nm, and since electrons and holes are quantum confined, the continuous band structure becomes a discrete energy level structure with molecular properties, and fluorescence may be emitted after the quantum dot is stimulated.

The emission spectrum of a quantum dot may be controlled by changing the size of the quantum dot. By changing the size of a quantum dot and its chemical composition, its emission spectrum can cover the whole visible region. Taking a CdTe quantum dot as an example, when its particle size grows from 2.5 nm to 4.0 nm, the emission wavelength thereof may be red shifted from 510 nm to 660 nm.

Nowadays, with the light emission characteristics of quantum dots, quantum dots may be applied in an organic light emitting diode (OLED) display to achieve full colorization of an OLED, and generally an approach of embossing or transferring is adopted to prepare a quantum dot organic light emitting diode display. However, when the approach of embossing is adopted to prepare a quantum dot organic light emitting diode display, a mold should be designed; red, green and blue quantum dot light emitting layers should be formed by the mold respectively, and it is necessary to process a quantum dot material into ink when in preparation; therefore, the process adopting the approach of embossing is relatively complex; whereas when the approach of transferring is adopted to prepare a quantum dot organic light emitting diode display, the realization of colorization of the display needs transferring for three times; during the transferring, quantum dots are easily left over on a template; and the three colors (red, green, blue) are easy to be mixed; therefore, the adoption of the approach of transferring will lead to a low resolution of the display and it is difficult to realize a batch production.

SUMMARY OF THE INVENTION

Embodiments of the invention provide a hollow white composite quantum dot preparation method, a display panel and a display device for implement a quantum dot organic light emitting diode display for which the preparation process is simple and of which a batch production is facilitated.

A hollow white composite quantum dot preparation method provided by an embodiment of the invention comprises:

dissolving silicon dioxide nano particles to obtain a seed solution;

mixing and emulsifying unicolor quantum dots of different colors with a monomer, an initiator, a surfactant and a solvent, respectively, to obtain corresponding unicolor quantum dot emulsions;

dropping the individual unicolor quantum dot emulsions in the seed solution in sequence, such that the surfaces of the silicon dioxide nano particles are coated with the unicolor quantum dots in the individual unicolor quantum dot emulsions in sequence according to the dropping order so as to obtain white composite quantum dots; and placing the white composite quantum dots in an acid solution, removing the silicon dioxide nano particles in the white composite quantum dots and obtaining hollow white composite quantum dots.

The inventor has recognized that, although white light may also be formed when the RGB three-color quantum dots are mixed according to a certain proportion, the phenomenon of agglomeration will be generated when these three materials are mixed; since the three RGB quantum dot particles are different in size, they result in a poor uniformity of the mixture, and the spectrum will become non-uniform; and when the size of the quantum dots is at a nanometer level, the phenomena of agglomeration and quenching will also be generated when mixing. In the above described hollow white composite quantum dot preparation method provided by the embodiment of the invention, unicolor quantum dots of different colors are prepared into corresponding unicolor quantum dot emulsions through an emulsion polymerization technique, dissolved silicon dioxide nano particles are used as a seed solution, the individual unicolor quantum dot emulsions are dropped in the seed solution in sequence, such that the surfaces of the silicon dioxide nano particles are coated with the unicolor quantum dots in the individual unicolor quantum dot emulsions in sequence according to the dropping order so as to obtain white composite quantum dots, and finally, the white composite quantum dots are placed in an acid solution, and the silicon dioxide nano particles in the white composite quantum dots are removed to obtain hollow white composite quantum dots. The hollow white composite quantum dots obtained by the preparation method are controllable in particle size and uniform in size, and the problems of low quantum efficiency, poor stability of quantum dots, and the like are solved; besides, the color gamut of the hollow white composite quantum dots can be adjusted according to the desired color gamut in a practical application, such that the applicability is high, and the application range is wide; meanwhile, the hollow white composite quantum dots can also reduce the quenching effect of the three-color quantum dots, and further avoid the influence of an internal "solid" portion on light emission; and in addition, the preparation method is simple, and a batch production is facilitated.

Preferably, in order to facilitate implementation, in the preparation method provided by an embodiment of the invention, dropping the individual unicolor quantum dot emulsions in the seed solution in sequence so as to obtain white composite quantum dots particularly comprises:

heating the seed solution up to 60° C.-90° C.; and dropping the individual unicolor quantum dot emulsions in the seed solution in sequence at the dropping rate of 0.01 ml/min to 5 ml/min, and maintaining the temperature of the seed solution in which the unicolor quantum dot emulsions are dropped for 2 h to 10 h after dropping the individual unicolor quantum dot emulsions.

Preferably, in order to facilitate implementation, in the preparation method provided by an embodiment of the invention, placing the white composite quantum dots in an acid solution, removing the silicon dioxide nano particles in the white composite quantum dots and obtaining hollow white composite quantum dots particularly comprises:

soaking the white composite quantum dots in an acid solution with a set concentration for 1 h to 24 h, removing the silicon dioxide nano particles in the white composite quantum dots and obtaining hollow white composite quantum dots.

In order to facilitate implementation, in the preparation method provided by an embodiment of the invention, the acid solution is a hydrofluoric acid solution with a mass concentration of 3%-15%.

Preferably, in order to facilitate implementation, in the preparation method provided by an embodiment of the invention, the unicolor quantum dots of different colors are red quantum dots, green quantum dots and blue quantum dots.

Preferably, in order to facilitate implementation, in the preparation method provided by an embodiment of the invention, the molar ratio of the red quantum dots, the green quantum dots and the blue quantum dots is 0.2~0.6:1: 4.5~6.2.

Preferably, in order to obtain hollow white composite quantum dots with a high luminous efficiency, in the preparation method provided by an embodiment of the invention, dropping the individual unicolor quantum dot emulsions in the seed solution in sequence particularly comprises:

dropping the individual unicolor quantum dot emulsions in the seed solution in sequence according to the order of red quantum dots, green quantum dots and blue quantum dots.

Preferably, in order to facilitate implementation, in the preparation method provided by an embodiment of the invention, in the individual unicolor quantum dot emulsions, the mass percent of the unicolor quantum dots is 10%-80%, the mass percent of the monomer is 10%-70%, the mass percent of the initiator is 0.1%-5.6%, and the mass percent of the surfactant is 1%-10%.

Preferably, in order to facilitate implementation, in the preparation method provided by an embodiment of the invention, the monomer is one or a combination of olefins with the total number of carbon atoms of 4-24.

Preferably, in order to facilitate implementation, in the preparation method provided by an embodiment of the invention, the initiator is one or a combination of potassium persulfate, ammonium persulfate, sodium persulfate and hydrogen peroxide.

Preferably, in order to facilitate implementation, in the preparation method provided by an embodiment of the invention, the surfactant is one or a combination of sodium dodecyl sulfate, sodium dodecyl sulfonate, and cetyl trimethyl ammonium bromide.

A quantum dot light emitting diode display panel provided by an embodiment of the invention comprises an opposite substrate and an array substrate, a plurality of pixel units are arranged on the array substrate, and each of the pixel units has a plurality of sub-pixel units displaying different colors;

at the position of the array substrate corresponding to the individual sub-pixel units is arranged an electroluminescent structure composed of an anode layer, a white quantum dot light emitting layer and a cathode layer; wherein the white quantum dot light emitting layer is composed of hollow white composite quantum dots prepared by the above preparation method, and the white quantum dot light emitting layer is excited to emit white light when the holes in the anode layer and the electrons in the cathode layer are recombined in the white quantum dot light emitting layer;

in the quantum dot light emitting diode display panel, a color filter corresponding to the individual sub-pixel units is arranged; and the color filter is located between the white quantum dot light emitting layer and the opposite substrate.

With respect to the quantum dot light emitting diode display panel provided by the embodiment of the invention, since the light emitting layer is a white quantum dot light emitting layer, the light emitting layer is film-formed once and it is unnecessary to prepare R, G, B light emitting layers respectively, the process is simplified, the structure is simple, and a batch production is facilitated; furthermore, since the white quantum dot light emitting layer is composed of hollow white composite quantum dots, and the hollow white composite quantum dots may realize uniform deposition, have no agglomeration, have a good film-forming ability, and are well compatible with adjacent functional layers, it may improve the display quality of the display panel; in addition, the luminous efficiency of the white quantum dot light emitting layer is high, the light loss thereof is low, and it may overcome the disadvantage of a low life span of the display panel due to different luminous efficiencies of the three colors R, G, and B. Therefore, in the quantum dot light emitting diode display panel provided by the embodiment of the invention, the hollow white composite quantum dots as the white quantum dot light emitting layer, in combination with the color filter, can realize a full colorized quantum dot display with high stability, high luminance and a long life span, and effectively solve the difficulties of a complex process, a low resolution, a low life span, a batch production being difficult, etc. appearing in a full colorized quantum dot display prepared by way of embossing or transferring in the prior art.

A display device provided by an embodiment of the invention comprises a quantum dot light emitting diode display panel provided by an embodiment of the invention.

DETAILED DESCRIPTION OF THE INVENTION

Figure 1:
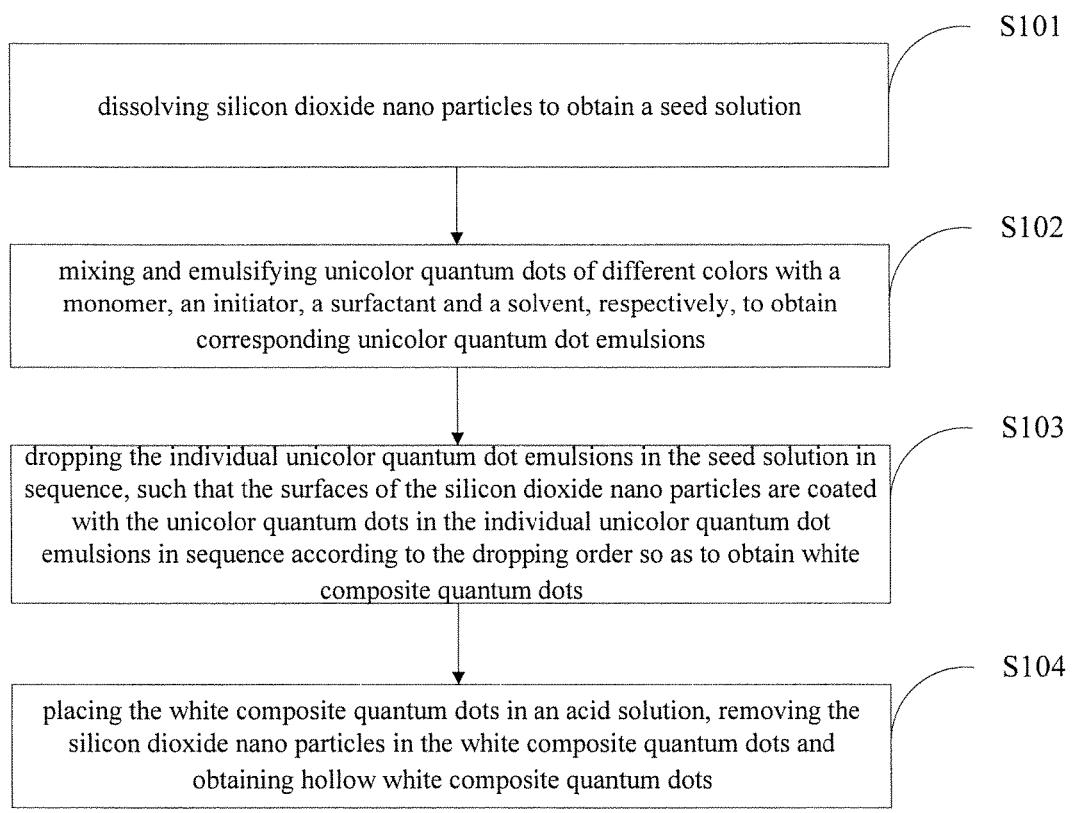
FIG. 1 is a flow chart of a hollow white composite quantum dot preparation method provided by an embodiment of the invention.

In the following, particular implementations of a hollow white composite quantum dot preparation method, a display panel and a display device provided by embodiments of the invention will be described in detail in connection with the drawings.

Therein, the thickness of respective layers of thin films in the drawings does not reflect the real scale of the array substrate or the opposite substrate, and the purpose is just to schematically illustrate the content of the invention.

A hollow white composite quantum dot preparation method provided by an embodiment of the invention, as shown in FIG. 1, particularly comprises the following steps:

S101: dissolving silicon dioxide nano particles to obtain a seed solution;

S102: mixing and emulsifying unicolor quantum dots of different colors with a monomer, an initiator, a surfactant and a solvent, respectively, to obtain corresponding unicolor quantum dot emulsions;

S103: dropping the individual unicolor quantum dot emulsions in the seed solution in sequence, such that the surfaces of the silicon dioxide nano particles are coated with the unicolor quantum dots in the individual unicolor quantum dot emulsions in sequence according to the dropping order so as to obtain white composite quantum dots; and S104: placing the white composite quantum dots in an acid solution, removing the silicon dioxide nano particles in the white composite quantum dots and obtaining hollow white composite quantum dots.

In the above described hollow white composite quantum dot preparation method provided by the embodiment of the invention, unicolor quantum dots of different colors are prepared into corresponding unicolor quantum dot emulsions through an emulsion polymerization technique, dissolved silicon dioxide nano particles are used as a seed solution, the individual unicolor quantum dot emulsions are dropped in the seed solution in sequence, such that the surfaces of the silicon dioxide nano particles are coated with the unicolor quantum dots in the individual unicolor quantum dot emulsions in sequence according to the dropping order so as to obtain white composite quantum dots, and finally, the white composite quantum dots are placed in an acid solution, and the silicon dioxide nano particles in the white composite quantum dots are removed to obtain hollow white composite quantum dots. The hollow white composite quantum dots obtained by the preparation method are controllable in particle size and uniform in size, and the problems of low quantum efficiency, poor stability of quantum dots, and the like are solved; besides, the color gamut of the hollow white composite quantum dots can be adjusted according to the desired color gamut in a practical application, such that the applicability is high, and the application range is wide; meanwhile, the hollow white composite quantum dots can also reduce the quenching effect of the three-color quantum dots, and further avoid the influence of an internal "solid" portion on light emission; and in addition, the preparation method is simple, and a batch production is facilitated.

It should be noted that, in the preparation method provided by the embodiment of the invention, the unicolor quantum dots may be composed of dots of the same material and the same size, or also may be composed of dots of different materials, as long as the size of individual quantum dots in the quantum dots of the materials is controlled to ensure that after excited, they issue unicolor light of a specified color. The unicolor quantum dots of different colors may be red quantum dots, blue quantum dots and green quantum dots, or also may be red quantum dots, blue quantum dots, green quantum dots and unicolor quantum dots of other color, and of course may further be unicolor quantum dots of a plurality of other colors, as long as it is ensured that after these unicolor quantum dots of different colors are mixed according to a certain proportion, the prepared hollow white composite quantum dots may emit white light after excited.

In particular, in the preparation method provided by an embodiment of the invention, the silicon dioxide nano particles may be prepared by adopting the sol-gel method, which is a prior art and will not be introduced here.

Preferably, in the preparation method provided by an embodiment of the invention, the surfaces of the silicon dioxide nano particles are modified with polymerizable double bonds. In a particular implementation, the polymerizable double bonds may be introduced in the procedure of preparing the silicon dioxide nano particles, and of course, it may also be possible to modify already prepared silicon dioxide nano particles, such that their surfaces are modified with the polymerizable double bonds.

Further, in the preparation method provided by an embodiment of the invention, silicon dioxide nano particles of uniform size are selected and used, and in a particular implementation, the particle size of the silicon dioxide nano particles may be controlled to be between 20 nm and 500 nm. Preferably, the particle size of the silicon dioxide nano particles is controlled to be between 50 nm and 150 nm.

Further, in the preparation method provided by an embodiment of the invention, the step S103 of dropping the individual unicolor quantum dot emulsions in the seed solution in sequence so as to obtain white composite quantum dots may particularly comprise:

heating the seed solution up to 60° C.-90° C.; and dropping the individual unicolor quantum dot emulsions in the seed solution in sequence at the dropping rate of 0.01 ml/min to 5 ml/min, and maintaining the temperature of the seed solution in which the unicolor quantum dot emulsions are dropped for 2 h to 10 h after dropping the individual unicolor quantum dot emulsions.

Preferably, in the preparation method provided by an embodiment of the invention, the seed solution may be heated up to the temperature between 75° C. and 85° C., and in a particular implementation, the seed solution is preferably heated up to the temperature of 80° C.

Preferably, in a particular implementation, in the preparation method provided by an embodiment of the invention, the individual unicolor quantum dot emulsions may be dropped in the seed solution in sequence at the dropping rate of 0.1 ml/min to 0.5 ml/min; further, the temperature of the seed solution in which the unicolor quantum dot emulsions are dropped is preferably maintained for 4 h to 8 h after dropping the individual unicolor quantum dot emulsions.

Further, in the preparation method provided by an embodiment of the invention, the step S104 of placing the white composite quantum dots in an acid solution, removing the silicon dioxide nano particles in the white composite quantum dots and obtaining hollow white composite quantum dots particularly comprises:

soaking the white composite quantum dots in an acid solution with a set concentration for 1 h to 24 h, removing the silicon dioxide nano particles in the white composite quantum dots and obtaining hollow white composite quantum dots.

In particular, in a particular implementation, in the preparation method provided by an embodiment of the invention, the acid solution may in particular be a hydrofluoric acid solution, and the mass concentration of the hydrofluoric acid solution is between 3% and 15%. Preferably, in the preparation method provided by an embodiment of the invention, the mass concentration of the hydrofluoric acid solution is preferably between 4% and 10%.

Further, in a particular implementation, in the preparation method provided by an embodiment of the invention, in order to remove the silicon dioxide nano particles in the white composite quantum dots, the white composite quantum dots are preferably soaked in an acid solution with a set concentration for 4 h to 12 h.

Preferably, in order to facilitate implementation, in the preparation method provided by an embodiment of the invention, the colors of the unicolor quantum dots of different colors are selected to be three primary colors, namely, the unicolor quantum dots of different colors are red quantum dots, green quantum dots and blue quantum dots.

In particular, in the preparation method provided by an embodiment of the invention, when the molar ratio of the red quantum dots, the green quantum dots and the blue quantum dots is 0.2~0.6:1:4.5~6.2, hollow white composite quantum dots prepared by these three kinds of unicolor quantum dots will emit white light after excited. Preferably, in a particular implementation, the molar ratio of the red quantum dots, the green quantum dots and the blue quantum dots may be controlled to be 0.35~0.55:1:4.75~5.25.

Further, in the preparation method provided by an embodiment of the invention, in a particular implementation, the molar ratio of the red quantum dots, the green quantum dots and the blue quantum dots may be adjusted according to the requirements of different color gamuts. Therefore, for the hollow white composite quantum dot obtained by adopting the preparation method provided by an embodiment of the invention, since its color gamut may be adjusted, the practicability of the hollow white composite quantum dot is strong, and the application range thereof is wide.

Further, in a particular implementation, in the preparation method provided by an embodiment of the invention, the red quantum dots may be selected to be CdSe quantum dots with the emission wavelength of 613 nm, and of course, the material of the red quantum dots may also be selected to be other material which can implement the solution of the invention.

Further, in a particular implementation, in the preparation method provided by an embodiment of the invention, the green quantum dots may be selected to be CdSe quantum dots with the emission wavelength of 555 nm, and of course, the material of the green quantum dots may also be selected to be other material which can implement the solution of the invention.

Further, in a particular implementation, in the preparation method provided by an embodiment of the invention, the blue quantum dots may be selected to be CdSe quantum dots with the emission wavelength of 452 nm, and of course, the material of the blue quantum dots may also be selected to be other material which can implement the solution of the invention.

In particular, in a particular implementation, in the preparation method provided by an embodiment of the invention, the order in which unicolor quantum dot emulsions of three colors, i.e., the red quantum dot emulsion prepared by the red quantum dots, the green quantum dot emulsion prepared by the green quantum dots, and the blue quantum dot emulsion prepared by the blue quantum dots, are dropped in the seed solution in sequence, is not limited, and they may be dropped according to the order of the red quantum dot emulsion, the green quantum dot emulsion and the blue quantum dot emulsion, or also may be dropped according to the order of the green quantum dot emulsion, the red quantum dot emulsion and the blue quantum dot emulsion, or may further be dropped according to other order of a combination of the three unicolor quantum dot emulsions.

Preferably, in the preparation method provided by an embodiment of the invention, dropping the individual unicolor quantum dot emulsions in the seed solution particularly comprises:

dropping the individual unicolor quantum dot emulsions in the seed solution in sequence according to the order of red quantum dots, green quantum dots and blue quantum dots.

Figure 2:
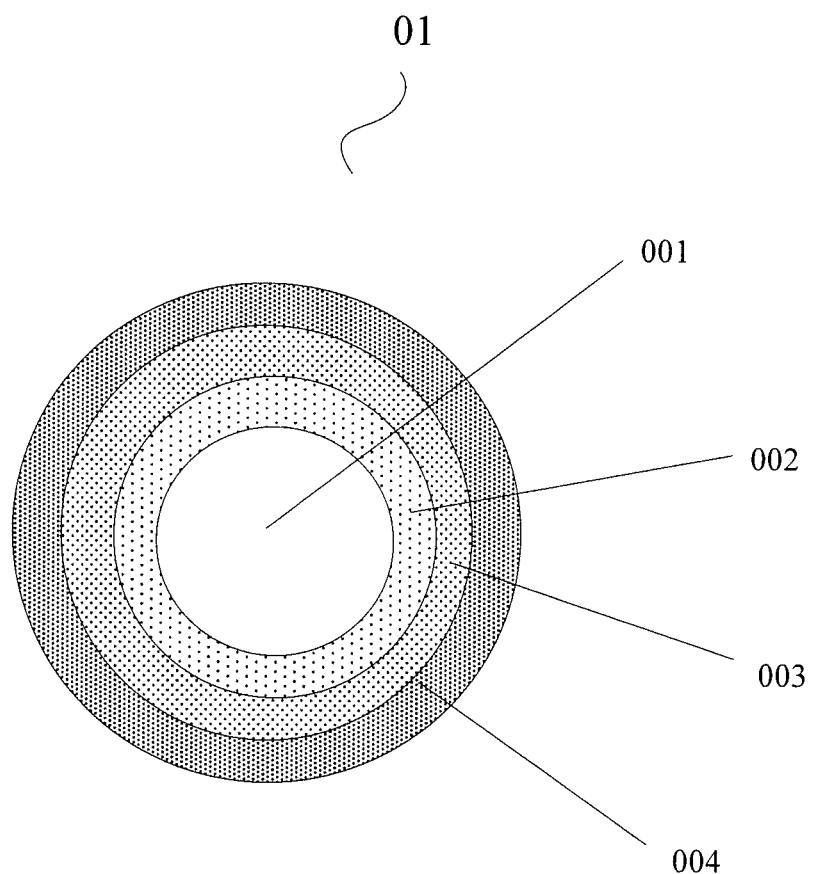
FIG. 2 is a structure diagram of a hollow white composite quantum dot provided by an embodiment of the invention.

The structure of a hollow white composite quantum dot prepared by dropping according to the above order is as shown in FIG. 2, from the center to outside of the hollow white composite quantum dot 01 are in sequence a hollow core 001, a red quantum dot 002, a green quantum dot layer 003 and a blue quantum dot layer 004. As such, when the hollow white composite quantum dot 01 is excited, the blue light emitted by the blue quantum dot layer located outermost may further excite the inner red quantum dot layer 002 and green quantum dot layer 003 to emit light, thereby forming a synergistic superposition effect and enhancing the luminous efficiency of the hollow white composite quantum dot 01; meanwhile, since the absorption rate of light by a red quantum dot is the largest, the positioning of the red quantum dot layer 002 in the innermost layer of the hollow white composite quantum dot 01 may reduce the absorption of other light by the red quantum dot, thereby further enhancing the luminous efficiency of the hollow white composite quantum dot 01.

Further, in a particular implementation, in the preparation method provided by an embodiment of the invention, in the individual unicolor quantum dot emulsions, when the mass percent of the unicolor quantum dots is 10%-80%, the mass percent of the monomer is 10%-70%, the mass percent of the initiator is 0.1%-5.6%, and the mass percent of the surfactant is 1%-10%, a better effect may be achieved.

In particular, in a particular implementation, in the preparation method provided by an embodiment of the invention, the monomer may be one or a combination of olefins with the total number of carbon atoms of 4-24, and of course, the monomer may also be other material which can implement the solution of the invention.

In particular, in a particular implementation, in the preparation method provided by an embodiment of the invention, the initiator may be one or a combination of potassium persulfate, ammonium persulfate, sodium persulfate and hydrogen peroxide, and of course, the initiator may also be other material which can implement the solution of the invention.

In particular, in a particular implementation, in the preparation method provided by an embodiment of the invention, the surfactant may be one or a combination of sodium dodecyl sulfate, sodium dodecyl sulfonate, and cetyl trimethyl ammonium bromide, and of course, the surfactant may also be other material which can implement the solution of the invention.

In the following, the method for preparing a white quantum dot composite material provided by the embodiments of the invention will be described in detail through three specific examples.

Example 1

Selecting red quantum dots, green quantum dots and blue quantum dots as the light emitting materials for preparing a white quantum dot composite material, the method for preparing a white quantum dot composite material particularly comprises the following steps:

(1) dispersing uniformly 1 g of silicon dioxide nano particles with the diameter of 100 nm in 15 g of water, uniformly dispersing them ultrasonically, so as to obtain a seed solution of silicon dioxide nano particles with the mass percent of 6.6%;

(2) mixing and ultrasonically emulsifying the aqueous solution of 0.05 g of red quantum dots, 0.2 g of monomers of styrene (St), 0.1 g of emulsifiers of sodium dodecyl sulfonate (SDS), and 0.2 g of initiators of potassium persulfate (KPS) with the mass concentration of 1% and 5 g of solvent of water, so as to obtain a red quantum dot emulsion;

mixing and ultrasonically emulsifying the aqueous solution of 0.05 g of green quantum dots, 0.2 g of monomers of styrene (St), 0.1 g of emulsifiers of sodium dodecyl sulfonate (SDS), and 0.2 g of initiators of potassium persulfate (KPS) with the mass concentration of 1% and 5 g of solvent of water, so as to obtain a green quantum dot emulsion;

mixing and ultrasonically emulsifying the aqueous solution of 0.05 g of blue quantum dots, 0.2 g of monomers of styrene (St), 0.1 g of emulsifiers of sodium dodecyl sulfonate (SDS), and 0.2 g of initiators of potassium persulfate (KPS) with the mass concentration of 1% and 5 g of solvent of water, so as to obtain a blue quantum dot emulsion;

(3) heating the seed solution up to 80° C.;

(4) starting to drop the red quantum dot emulsion in the seed solution at the dropping rate of 0.1 ml/min, and after the dropping is finished, maintaining the temperature for 4 hours, wherein the surfaces of the silicon dioxide nano particles are coated with the red quantum dots in the red quantum dot emulsion;

(5) starting to drop the green quantum dot emulsion in the solution obtained in the step (4) at the dropping rate of 0.1 ml/min, and after the dropping is finished, maintaining the temperature for 4 hours, wherein the surfaces of the red quantum dots of the silicon dioxide nano particles are coated with the green quantum dots in the green quantum dot emulsion;

(6) starting to drop the blue quantum dot emulsion in the solution obtained in the step (5) at the dropping rate of 0.1 ml/min, and after the dropping is finished, maintaining the temperature for 4 hours, so as to obtain white composite quantum dots composed of the silicon dioxide nano particles and the red quantum dots, the green quantum dots and the blue quantum dots which coat the surfaces of the silicon dioxide nano particles in sequence;

(7) soaking the white composite quantum dots in an aqueous solution of hydrofluoric acid with the mass concentration of 4% for 5 h, centrifugally washing the product with alcohol/water, and removing the silicon dioxide nano particles in the white composite quantum dots, so as to obtain hollow white composite quantum dots.

Example 2

Selecting red quantum dots, green quantum dots and blue quantum dots as the light emitting materials for preparing a white quantum dot composite material, the method for preparing a white quantum dot composite material particularly comprises the following steps:

(1) dispersing uniformly 1 g of silicon dioxide nano particles with the diameter of 100 nm in 15 g of water, uniformly dispersing them ultrasonically, so as to obtain a seed solution of silicon dioxide nano particles with the mass percent of 6.6%;

(2) mixing and ultrasonically emulsifying the aqueous solution of 0.06 g of red quantum dots, 0.25 g of monomers of styrene (St), 0.1 g of emulsifiers of sodium dodecyl sulfonate (SDS), and 0.25 g of initiators of potassium persulfate (KPS) with the mass concentration of 1% and 5 g of solvent of water, so as to obtain a red quantum dot emulsion;

mixing and ultrasonically emulsifying the aqueous solution of 0.06 g of green quantum dots, 0.25 g of monomers of styrene (St), 0.1 g of emulsifiers of sodium dodecyl sulfonate (SDS), and 0.25 g of initiators of potassium persulfate (KPS) with the mass concentration of 1% and 5 g of solvent of water, so as to obtain a green quantum dot emulsion; mixing and ultrasonically emulsifying the aqueous solution of 0.06 g of blue quantum dots, 0.25 g of monomers of styrene (St), 0.1 g of emulsifiers of sodium dodecyl sulfonate (SDS), and 0.25 g of initiators of potassium persulfate (KPS) with the mass concentration of 1% and 5 g of solvent of water, so as to obtain a blue quantum dot emulsion;

(3) heating the seed solution up to 70° C.;

(4) starting to drop the red quantum dot emulsion in the seed solution at the dropping rate of 0.12 ml/min, and after the dropping is finished, maintaining the temperature for 4 hours, wherein the surfaces of the silicon dioxide nano particles are coated with the red quantum dots in the red quantum dot emulsion;

(5) starting to drop the green quantum dot emulsion in the solution obtained in the step (4) at the dropping rate of 0.12 ml/min, and after the dropping is finished, maintaining the temperature for 4 hours, wherein the surfaces of the red quantum dots of the silicon dioxide nano particles are coated with the green quantum dots in the green quantum dot emulsion;

(6) starting to drop the blue quantum dot emulsion in the solution obtained in the step (5) at the dropping rate of 0.12 ml/min, and after the dropping is finished, maintaining the temperature for 4 hours, so as to obtain white composite quantum dots composed of the silicon dioxide nano particles and the red quantum dots, the green quantum dots and the blue quantum dots which coat the surfaces of the silicon dioxide nano particles in sequence;

(7) soaking the white composite quantum dots in an aqueous solution of hydrofluoric acid with the mass concentration of 4% for 5 h, centrifugally washing the product with alcohol/water, and removing the silicon dioxide nano particles in the white composite quantum dots, so as to obtain hollow white composite quantum dots.

Example 3

Selecting red quantum dots, green quantum dots and blue quantum dots as the light emitting materials for preparing a white quantum dot composite material, the method for preparing a white quantum dot composite material particularly comprises the following steps:

(1) dispersing uniformly 1 g of silicon dioxide nano particles with the diameter of 100 nm in 15 g of water, uniformly dispersing them ultrasonically, so as to obtain a seed solution of silicon dioxide nano particles with the mass percent of 6.6%;

(2) mixing and ultrasonically emulsifying the aqueous solution of 0.05 g of red quantum dots, 0.2 g of monomers of methyl methacrylate (PMMA), 0.1 g of emulsifiers of sodium dodecyl sulfonate (SDS), and 0.2 g of initiators of potassium persulfate (KPS) with the mass concentration of 1% and 5 g of solvent of water, so as to obtain a red quantum dot emulsion;

mixing and ultrasonically emulsifying the aqueous solution of 0.05 g of green quantum dots, 0.2 g of monomers of methyl methacrylate (PMMA), 0.1 g of emulsifiers of sodium dodecyl sulfonate (SDS), and 0.2 g of initiators of potassium persulfate (KPS) with the mass concentration of 1% and 5 g of solvent of water, so as to obtain a green quantum dot emulsion;

mixing and ultrasonically emulsifying the aqueous solution of 0.05 g of blue quantum dots, 0.2 g of monomers of methyl methacrylate (PMMA), 0.1 g of emulsifiers of sodium dodecyl sulfonate (SDS), and 0.2 g of initiators of potassium persulfate (KPS) with the mass concentration of 1% and 5 g of solvent of water, so as to obtain a blue quantum dot emulsion;

(3) heating the seed solution up to 80° C.;

(4) starting to drop the red quantum dot emulsion in the seed solution at the dropping rate of 0.1 ml/min, and after the dropping is finished, maintaining the temperature for 4 hours, wherein the surfaces of the silicon dioxide nano particles are coated with the red quantum dots in the red quantum dot emulsion;

(5) starting to drop the green quantum dot emulsion in the solution obtained in the step (4) at the dropping rate of 0.1 ml/min, and after the dropping is finished, maintaining the temperature for 4 hours, wherein the surfaces of the red quantum dots of the silicon dioxide nano particles are coated with the green quantum dots in the green quantum dot emulsion;

(6) starting to drop the blue quantum dot emulsion in the solution obtained in the step (5) at the dropping rate of 0.1 ml/min, and after the dropping is finished, maintaining the temperature for 4 hours, so as to obtain white composite quantum dots composed of the silicon dioxide nano particles and the red quantum dots, the green quantum dots and the blue quantum dots which coat the surfaces of the silicon dioxide nano particles in sequence;

(7) soaking the white composite quantum dots in an aqueous solution of hydrofluoric acid with the mass concentration of 4% for 5 h, centrifugally washing the product with alcohol/water, and removing the silicon dioxide nano particles in the white composite quantum dots, so as to obtain hollow white composite quantum dots.

Figure 3A:
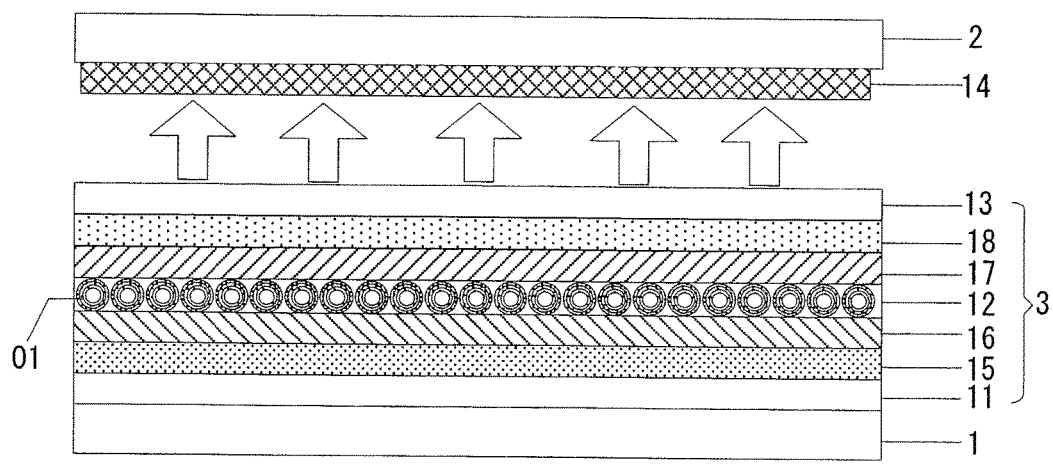
FIGS. 3*a* and 3*b* are structure diagrams of a quantum dot light emitting diode display panel provided by embodiments of the invention respectively.
Figure 3B:
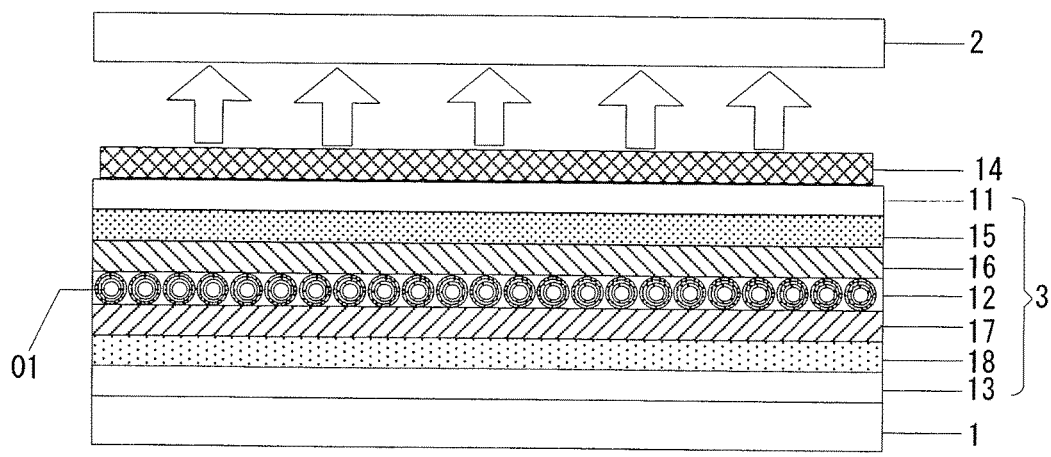

Based on one and the same inventive concept, an embodiment of the invention further provides a quantum dot light emitting diode display panel, which, as shown in FIGS. 3a and 3b, comprises an opposite substrate 2 and an array substrate 1, a plurality of pixel units are arranged on the array substrate 1, and each of the pixel units has a plurality of sub-pixel units displaying different colors;

at the position of the array substrate 1 corresponding to the individual sub-pixel units is arranged an electroluminescent structure 3 composed of an anode layer 11, a white quantum dot light emitting layer 12 and a cathode layer 13; wherein the white quantum dot light emitting layer 12 is composed of hollow white composite quantum dots 01 prepared by the above preparation method, and the white quantum dot light emitting layer 12 is excited to emit white light when the holes in the anode layer 11 and the electrons in the cathode layer 13 are recombined in the white quantum dot light emitting layer 12;

in the quantum dot light emitting diode display panel, a color filter 14 corresponding to the individual sub-pixel units is arranged; and the color filter 14 is located between the white quantum dot light emitting layer 12 and the opposite substrate 2.

With respect to the quantum dot light emitting diode display panel provided by the embodiment of the invention, since the light emitting layer is a white quantum dot light emitting layer, the light emitting layer is film-formed once and it is unnecessary to prepare R, G, B light emitting layers respectively, the process is simplified, the structure is simple, and a batch production is facilitated; furthermore, since the white quantum dot light emitting layer is composed of hollow white composite quantum dots, and yet the hollow white composite quantum dots may realize uniform deposition, have no agglomeration, have a good film-forming ability, and are well compatible with adjacent functional layers, it may improve the display quality of the display panel; in addition, the luminous efficiency of the white quantum dot light emitting layer is high, the light loss thereof is low, and it may overcome the disadvantage of a low life span of the display panel due to different luminous efficiencies of the three colors R, G, and B. Therefore, in the quantum dot light emitting diode display panel provided by the embodiment of the invention, the hollow white composite quantum dots as the white quantum dot light emitting layer, in combination with the color filter, may realize a full colorized quantum dot display with high stability, high luminance and a long life span, and effectively solve the difficulties of a complex process, a low resolution, a low life span, a batch production being difficult, etc. appearing in a full colorized quantum dot display prepared by way of embossing or transferring in the prior art.

While in FIGS. 3a and 3b of the disclosure, the white quantum dot light emitting layer 12 is shown as a single layer, it will be appreciated by the skilled in the art that, the white quantum dot light emitting layer with a multi-layer structure (e.g., 2~5 layers) is also feasible. Since the size uniformity of the composite particles in the invention is good, and they are spherical, it is easy to form an orderly arrangement. The orderly arrangement may achieve many advantages such as a uniform interface, a high quantum efficiency and a high resolution, etc.

In particular, in a particular implementation, in the display panel provided by an embodiment of the invention, the white quantum dot light emitting layer in the electroluminescent structure adopts a hollow white composite quantum dot material and may be formed by a process such as spin-coating, inkjet printing, etc.

Preferably, in the display panel provided by an embodiment of the invention, the structure of the hollow white composite quantum dots 01 is, as shown in FIG. 2, composed of the red quantum dot layer 002, the green quantum dot layer 003 and the blue quantum dot layer 004 which coat the hollow core 001 in sequence.

Further, in the display panel provided by an embodiment of the invention, as shown in FIG. 3b, the color filter 14 may be located on the side of the array substrate 1 facing the opposite substrate 2, and of course, as shown in FIG. 3a, the color filter 14 may also be located on the side of the opposite substrate 2 facing the array substrate 1.

In particular, in the display panel provided by an embodiment of the invention, as shown in FIG. 3a, the electroluminescent structure 3 may be composed of the anode layer 11, the white quantum dot light emitting layer 12 and the cathode layer 13 which are arranged on the array substrate 1 in sequence, and of course, as shown in FIG. 3b, the electroluminescent structure 3 may also be composed of the cathode layer 13, the white quantum dot light emitting layer 12 and the anode layer 11 which are arranged on the array substrate 1 in sequence.

Further, in the display panel provided by an embodiment of the invention, as shown in FIGS. 3a and 3b, between the anode layer 11 and the white quantum dot light emitting layer 12 are further arranged a hole injection layer 15 and a hole transfer layer 16, and between the white quantum dot light emitting layer 12 and the cathode layer 13 are further arranged an electron transfer layer 17 and an electron injection layer 18, wherein the hole injection layer 15, the hole transfer layer 16, the electron transfer layer 17 and the electron injection layer 18 are a prior art, and will not be introduced here.

Based on one and the same inventive concept, an embodiment of the invention further provides a display device comprising the quantum dot light emitting diode display panel provided by an embodiment of the invention, and since the principle to solve the problem of the device is similar to that of the quantum dot light emitting diode display panel, the implementation of the device may refer to that of the display panel, and the repetitions will not be introduced any more.

In a hollow white composite quantum dot preparation method provided by embodiments of the invention, unicolor quantum dots of different colors are prepared into corresponding unicolor quantum dot emulsions through an emulsion polymerization technique, dissolved silicon dioxide nano particles are used as a seed solution, the individual unicolor quantum dot emulsions are dropped in the seed solution in sequence, such that the surfaces of the silicon dioxide nano particles are coated with the unicolor quantum dots in the individual unicolor quantum dot emulsions in sequence according to the dropping order so as to obtain white composite quantum dots, and finally, the white composite quantum dots are placed in an acid solution, and the silicon dioxide nano particles in the white composite quantum dots are removed to obtain hollow white composite quantum dots. The hollow white composite quantum dots obtained by the preparation method are controllable in particle size and uniform in size, and the problems of low quantum efficiency, poor stability of quantum dots, and the like are solved; besides, the color gamut of the hollow white composite quantum dots can be adjusted according to the desired color gamut in a practical application, so that the applicability is high, and the application range is wide; meanwhile, the hollow white composite quantum dots may also reduce the quenching effect of the three-color quantum dots; and in addition, the preparation method is simple, and a batch production is facilitated.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

The invention claimed is:

1. A hollow white composite quantum dot preparation method, comprising:
   dissolving silicon dioxide nano particles to obtain a seed solution;
   mixing and emulsifying unicolor quantum dots of different colors with a monomer, an initiator, a surfactant and a solvent, respectively, to obtain corresponding unicolor quantum dot emulsions;
   dropping the individual unicolor quantum dot emulsions in the seed solution in sequence, such that the surfaces of the silicon dioxide nano particles are coated with the unicolor quantum dots in the individual unicolor quantum dot emulsions in sequence according to the dropping order so as to obtain white composite quantum dots; and
   placing the white composite quantum dots in an acid solution, removing the silicon dioxide nano particles in the white composite quantum dots and obtaining hollow white composite quantum dots.

2. The preparation method as claimed in claim 1, wherein dropping the individual unicolor quantum dot emulsions in the seed solution in sequence, such that the surfaces of the silicon dioxide nano particles are coated with the unicolor quantum dots in the individual unicolor quantum dot emulsions in sequence according to the dropping order so as to obtain white composite quantum dots comprises:
   heating the seed solution up to 60° C.-90° C.; and
   dropping the individual unicolor quantum dot emulsions in the seed solution in sequence at the dropping rate of 0.01 ml/min to 5 ml/min, and maintaining the temperature of the seed solution in which the unicolor quantum dot emulsions are dropped for 2 h to 10 h after dropping the individual unicolor quantum dot emulsions.

3. The preparation method as claimed in claim 1, wherein placing the white composite quantum dots in an acid solution, removing the silicon dioxide nano particles in the white composite quantum dots and obtaining hollow white composite quantum dots comprises:
   soaking the white composite quantum dots in an acid solution with a set concentration for 1 h to 24 h, removing the silicon dioxide nano particles in the white composite quantum dots and obtaining hollow white composite quantum dots.

4. The preparation method as claimed in claim 3, wherein the acid solution is a hydrofluoric acid solution with a mass concentration of 3%-15%.

5. The preparation method as claimed in claim 1, wherein the unicolor quantum dots of different colors are red quantum dots, green quantum dots and blue quantum dots.

6. The preparation method as claimed in claim 5, wherein the molar ratio of the red quantum dots, the green quantum dots and the blue quantum dots which are dropped in the seed solution is 0.2~0.6:1:4.5~6.2.

7. The preparation method as claimed in claim 5, wherein dropping the individual unicolor quantum dot emulsions in the seed solution in sequence comprises:
   dropping the individual unicolor quantum dot emulsions in the seed solution in sequence according to the order of red quantum dots, green quantum dots and blue quantum dots.

8. The preparation method as claimed in claim 1, wherein in the individual unicolor quantum dot emulsions, the mass percent of the unicolor quantum dots is 10%-80%, the mass percent of the monomer is 10%-70%, the mass percent of the initiator is 0.1%-5.6%, and the mass percent of the surfactant is 1%-10%.

9. The preparation method as claimed in claim 1, wherein the monomer is one or a combination of olefins with the total number of carbon atoms of 4-24.

10. The preparation method as claimed in claim 1, wherein the initiator is one or a combination of potassium persulfate, ammonium persulfate, sodium persulfate and hydrogen peroxide.

11. The preparation method as claimed in claim 1, wherein the surfactant is one or a combination of sodium dodecyl sulfate, sodium dodecyl sulfonate, and cetyl trimethyl ammonium bromide.

12. A quantum dot light emitting diode display panel, comprising an opposite substrate and an array substrate, a plurality of pixel units being arranged on the array substrate, and each of the pixel units having a plurality of sub-pixel units displaying different colors, wherein
   at the position of the array substrate corresponding to the individual sub-pixel units is arranged an electroluminescent structure composed of an anode layer, a white quantum dot light emitting layer and a cathode layer; wherein the white quantum dot light emitting layer is composed of hollow white composite quantum dots prepared by the preparation method as claimed in claim 1, and the white quantum dot light emitting layer is excited to emit white light when the holes in the anode layer and the electrons in the cathode layer are recombined in the white quantum dot light emitting layer; and
   in the quantum dot light emitting diode display panel, a color filter corresponding to the individual sub-pixel units is arranged; and the color filter is located between the white quantum dot light emitting layer and the opposite substrate.

13. A display device, comprising a quantum dot light emitting diode display device;

the quantum dot light emitting diode display device comprising an opposite substrate and an array substrate, a plurality of pixel units being arranged on the array substrate, and each of the pixel units having a plurality of sub-pixel units displaying different colors, wherein at the position of the array substrate corresponding to the individual sub-pixel units is arranged an electroluminescent structure composed of an anode layer, a white quantum dot light emitting layer and a cathode layer; wherein the white quantum dot light emitting layer is composed of hollow white composite quantum dots prepared by the preparation method as claimed in claim 1, and the white quantum dot light emitting layer is excited to emit white light when the holes in the anode layer and the electrons in the cathode layer are recombined in the white quantum dot light emitting layer; and in the quantum dot light emitting diode display panel, a color filter corresponding to the individual sub-pixel units is arranged; and the color filter is located between the white quantum dot light emitting layer and the opposite substrate.

* * * * *